United States Patent [19]
Cerra et al.

[11] 4,050,026
[45] Sept. 20, 1977

[54] DEVICE FOR FREQUENCY DISCRIMINATION OF ELECTRICAL SIGNALS

[76] Inventors: Raffaele Cerra, Via Cilea, 171 - 80100 - Naples; Michele Scherillo, Via Massimo Stanzione, 18 80100 - Naples, both of Italy

[21] Appl. No.: 671,373

[22] Filed: Mar. 29, 1976

[30] Foreign Application Priority Data

Mar. 28, 1975 Italy .................................. 48845/75

[51] Int. Cl.² ............................................. H03K 9/06
[52] U.S. Cl. ................................. 328/167; 333/70 R; 331/18; 329/117; 328/134
[58] Field of Search ...................... 328/134, 167, 165; 333/70 A, 70 R; 331/18; 329/117

[56] References Cited
U.S. PATENT DOCUMENTS

| | | | |
|---|---|---|---|
| 3,758,884 | 9/1973 | Bahler et al. | 333/70 A |
| 3,855,537 | 12/1974 | Condon | 328/167 |
| 3,961,172 | 6/1976 | Hutcheon | 328/167 X |
| 3,969,678 | 7/1976 | Asahara et al. | 328/167 |

Primary Examiner—John S. Heyman

[57] ABSTRACT

A device for filtering and frequency discrimination includes a filtering section and frequency discriminator connected in tandem. The filtering section consists of a bandpass filter and two resonant components in series. The discriminator includes two resonant components with their inputs connected in parallel, followed by respective detectors connected to respective inputs of an output differential amplifier. Each of the resonant components is a respective sampled filter tuned to a given respective frequency. Each of the sampled filters is controlled by a respective control signal of corresponding frequency, all control signals being derived from signals supplied from a single high-stability oscillator. The oscillator is preferably a quartz crystal-controlled oscillator.

5 Claims, 8 Drawing Figures

DEVICE FOR FREQUENCY DISCRIMINATION OF ELECTRICAL SIGNALS

BACKGROUND OF THE INVENTION

The present invention relates a high-stability device for the filtering and discrimination of an electric signal.

More specifically, the present invention concerns a device, which includes a filter section and a frequency discriminator, capable of detecting a variation in the frequency of an oscillator in relation to a given or center frequency, operating in such manner as to prevent, as much as possible the occurrence of output drift, even when the input signal is greatly affected by noise (that is, under conditions of low signal/noise ratio).

It is well known in the electronic arts how important it is to detect frequency variations in electric signals, for the purpose of using such information in operations such as generating oscillations and frequency tracking.

Known devices used for detecting such frequency variations typically consist of two basic systems: a filter section and a frequency discriminator.

The section allows only the frequencies that are close to a given or center frequency to pass through toward the discriminator, while the discriminator produces as output a signal, the amplitude of which is proportional to the frequency variation of the input signal in relation to the given or center frequency.

The discriminator generally is composed of two filters tuned, which are geometrically symmetrical with respect to the central frequency $f_0$, are referred to herein below as $f_1$ and $f_4$ (FIG. 1B). and are used to produce output signals or opposite signs.

For the purpose of obtaining adequate band width performance, the filter section sometimes includes two resonant circuits, tuned on two frequencies, which are geometrically very close and symmetrical with respect to the center frequency $f_0$ and referred to herein below as $f_2$ and $f_3$ (FIG. 1A).

For the proper operation of the system, the axis symmetry of the response curve of the discriminator must intersect the axis of the abscissae at a point, which corresponds to the center frequency $f_0$, and its value must be zero at that point.

Furthermore, the axis of symmetry of the response curve of the filter must coincide with the axis of symmetry of the curve of the discriminator.

Non-compliace with such specifications causes incorrect identification of variations from the center frequency $f_0$, particularly in the presence of input signals affected by noise. In order to meet such specifications and maintain reliable performance over time, it is necessary to build both the filter and the discriminator using circuits and components of high accuracy and stability (specifically, not affected by phenomena of thermal drift and aging).

Indeed, in the past, the low accuracy and stability of the traditional circuits composed of condensers and inductors caused extremely serious difficulties in building and operating devices made of such components.

A first attempt to overcome such obstacles was made by resorting to quartz-stabilized circuits, which, as is well known, have better properties with respect to accuracy and stability.

Even this solution, however, was found to be not without drawbacks, particularly in the design and final tuning stages, for the following reasons: the quartz circuits composing the filter and the discriminator must be tuned separately on frequencies $f_1$, $f_2$, $f_3$ and $f_4$;

the terminal and aging drifts in the various quartz circuits, although they are limited in extent, are uncoordinated with one another, thereby spoiling the alignment of the axes of symmetry; and the low-frequency quartz components are bulky and of low reliability, especially when exposed to shocks and vibrations, which constitutes a limitation that often renders them unacceptable in designing the usable frequency range.

SUMMARY OF THE INVENTION

The principal object of the present invention is to provide a device for the filtering and frequency discrimination of an electric signal which is particularly reliable with respect to accuracy and stability, while making possible an easy and rapid final tuning of the circuits of which it is composed.

A further object of the invention is to to provide a device for filtering and discrimination which is not subject to excessively restrictive design limitations with respect to the usable operating frequency range.

It has been found that the above-mentioned objects can be achieved by the present invention, which basically is a device in which the tuned circuits in both the filter and the discriminator sections are made of components of the "sampled filter" type and in controlling them with tuning frequencies signals which are rigidly controlled by a pilot frequency signal from a single quartz oscillator, which frequency is considerably greater than the tuning frequencies of the various filters.

The operation of "sampled filters", well known in the industry (see L. E. Franks and I. W. Sandberg, "An alternative approach to the realization of network transfer functions: the N-path filters", Bell Syst. Tech. Journal, Sept. 1960; Y. Sun and I.T. Frish, "A general theory of commutated network" IEEE Trans. of Circ. Theory, Nov. 1969; G. C. Temes and S. K. Mitra, "Modern filter theory and design", Ed. Wiley, Interscience), is illustrated by FIG. 2. which concerns the case of four samples in each period of the input signal frequency. A control signal of frequency $f_c$, fed through an electronic switching device, causes the selection of each of condensers $C_1$, $C_2$, $C_3$ and $C_4$ in cyclical succession.

Consequently, the input signal is applied in succession to a network RC, composed a respective resistance $R_1$ and of one of the capacities $C_1$, $C_2$, $C_3$ and $C_4$, selected at each sampling stage.

Such a network blocks all input signals, with the exception of those whose frequency is an integral odd multiple of the control frequency $f_c$. If a band-pass filter of conventional design, with a rather wide band, is connected to the output of the circuit described above, the harmonics of frequency $f_c$ are thereby suppressed. Thus, such network constitutes a band-pass filter having a center frequency which, for a given fixed number of the sampling condensers, is rigidly and exclusively determined by the control frequency $f_c$, while the values of $R_1$ and of the condensers $C_1$–$C_4$ only affect the shape of the response curve.

An advantage offered by the present invention is a result of the presence of a single quartz control circuit, which evidently results in a stable device and facilitates its setting.

A further advantage is achieved by the possible high operating frequency of the quartz control circuit, which makes possible using a quartz crystal of limited size and high performance.

An additional advantage consists in the fact that the alignment of the axes of symmetry of the response curves of the filter and of the discriminator is obtained automatically and does not require any final tuning operation.

Therefore, the present invention concerns a device for the filtering and frequency discrimination of an electric signal, composed of a filter and a discriminator connected in tandem, where the filter consists of a band-pass filter component and two resonant components in series and the discriminator consists of two resonant components with the inputs arranged in parallel, each followed by a detecting device connected to one of the inputs of an output differential amplifier, characterized by the fact that such resonant components consist of sampled filters, the control frequencies of which all all obtained from the signal produced by a high-stability oscillator, processed through a control frequency generator.

Typically, the oscillator is composed of a quartz oscillating circuit, but can be built by any other method suitable to produce high-stability oscillations.

BRIEF DESCRIPTION OF THE DRAWINGS

The invention will presently be described in further detail, with reference to the attached drawings, where.

DETAILED DESCRIPTION OF THE PREFERRED EMBODIMENTS

Figure 3:
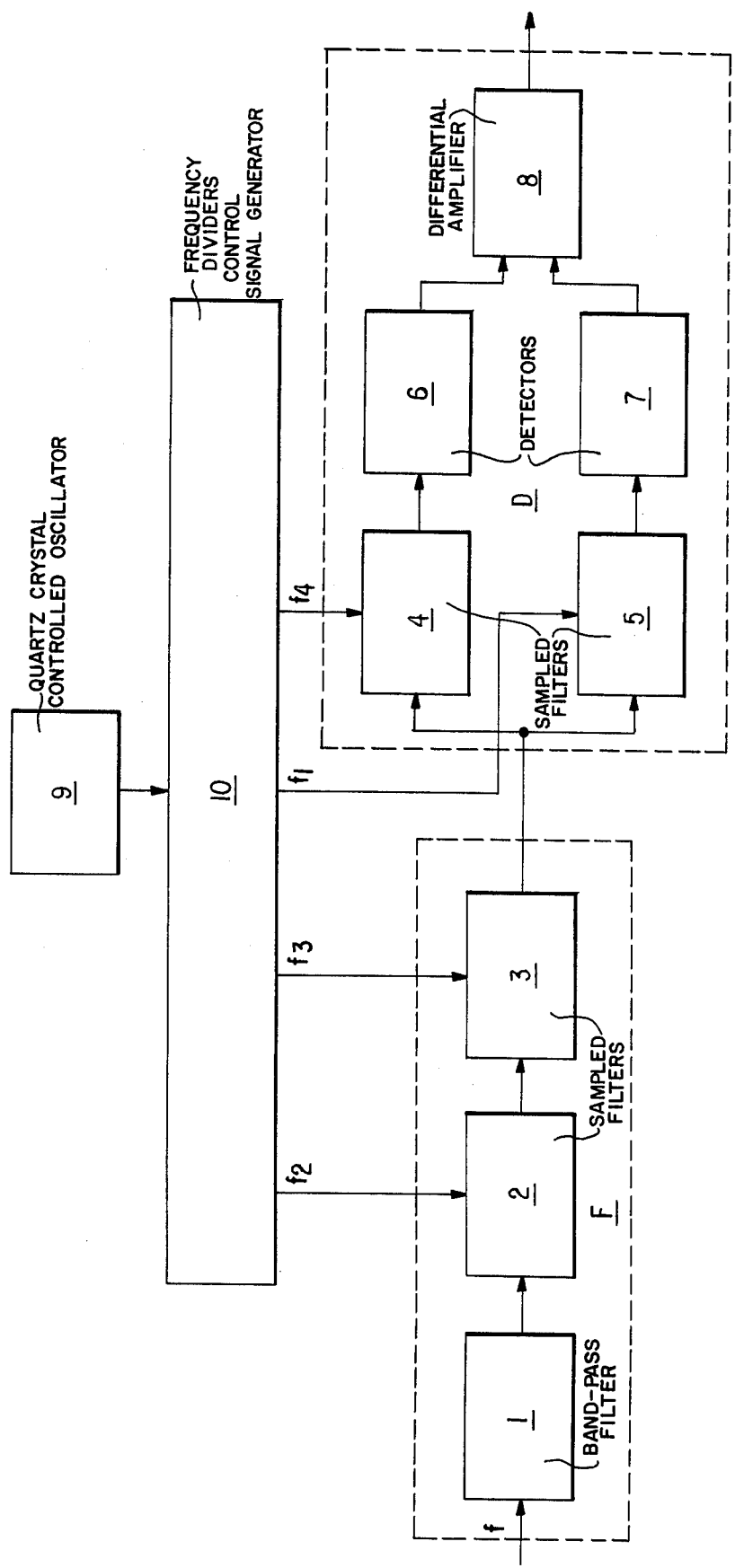
FIG. 3 is a schematic block diagram of the device according to the present invention.

The invention is now be described, with specific reference to FIG. 3.

Figure 1A:
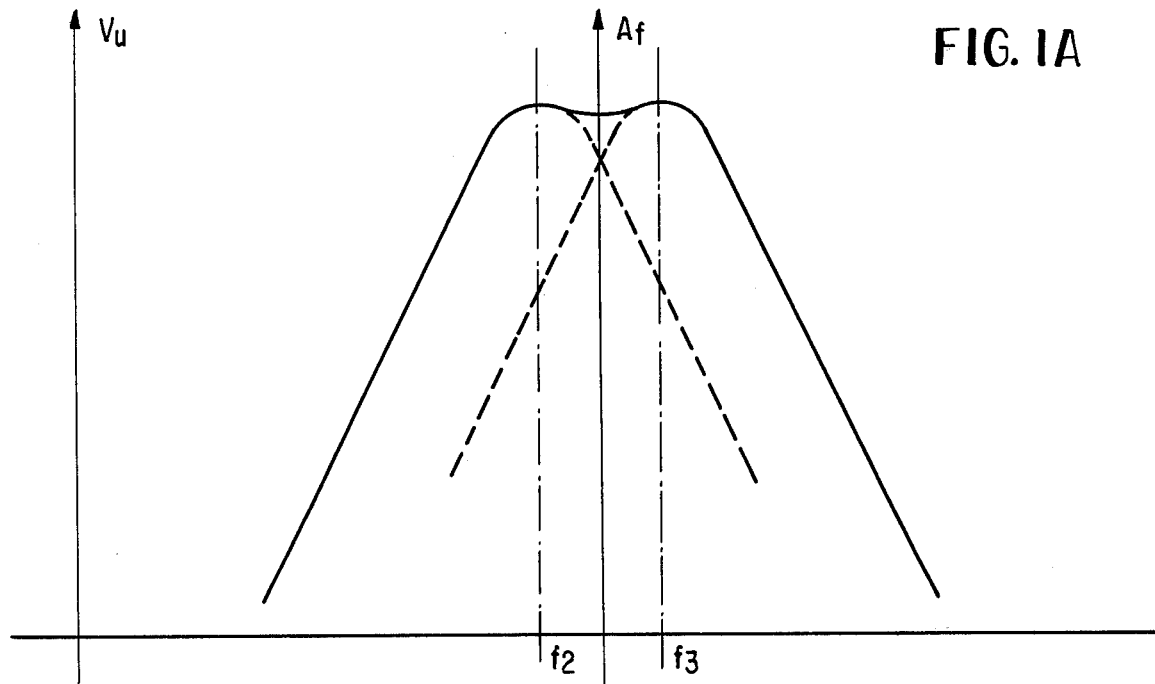
FIG. 1A and 1B show the frequency response curves of the filter and of the discriminator, respectively.

The input signal I is applied to a filter F constituted by a first band-pass filter 1 of conventional design, the purpose of which is to suppress all the interference frequencies outside the band under consideration. The output of the filter 1 is connected to the input of two sampled filters connected in series and controlled by two signals, having respective frequencies $f_2$ and $f_3$, close to one another, so as to obtain, by a well-known technique, a filter having the desired band width (see FIG. 1A and 4).

Figure 1B:
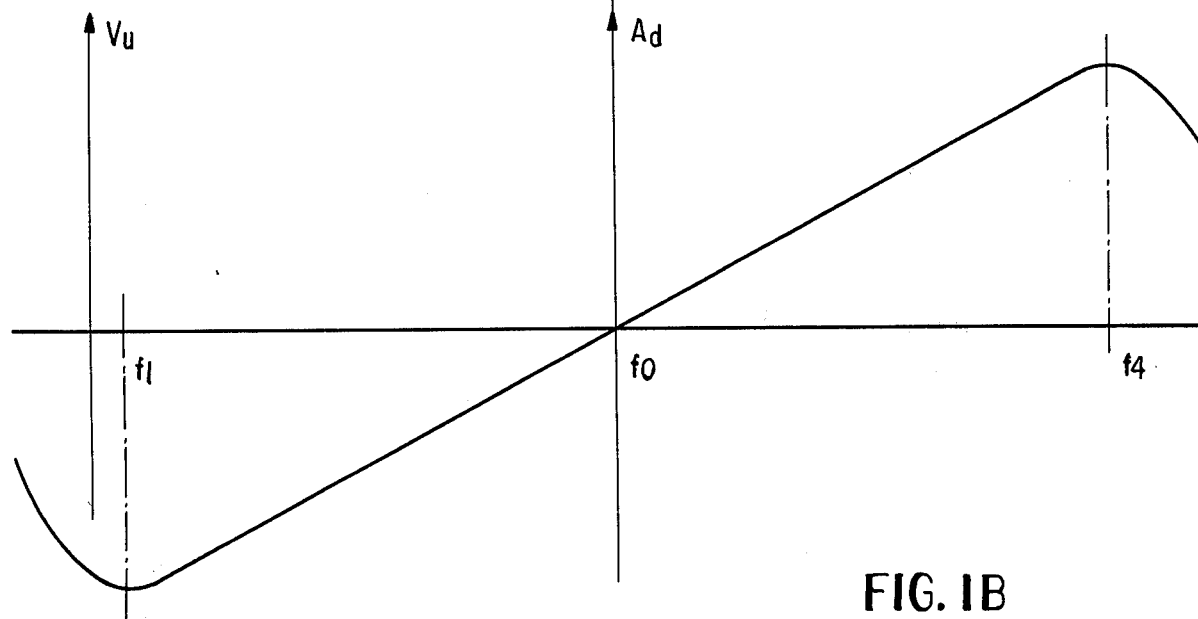
Figure 2:
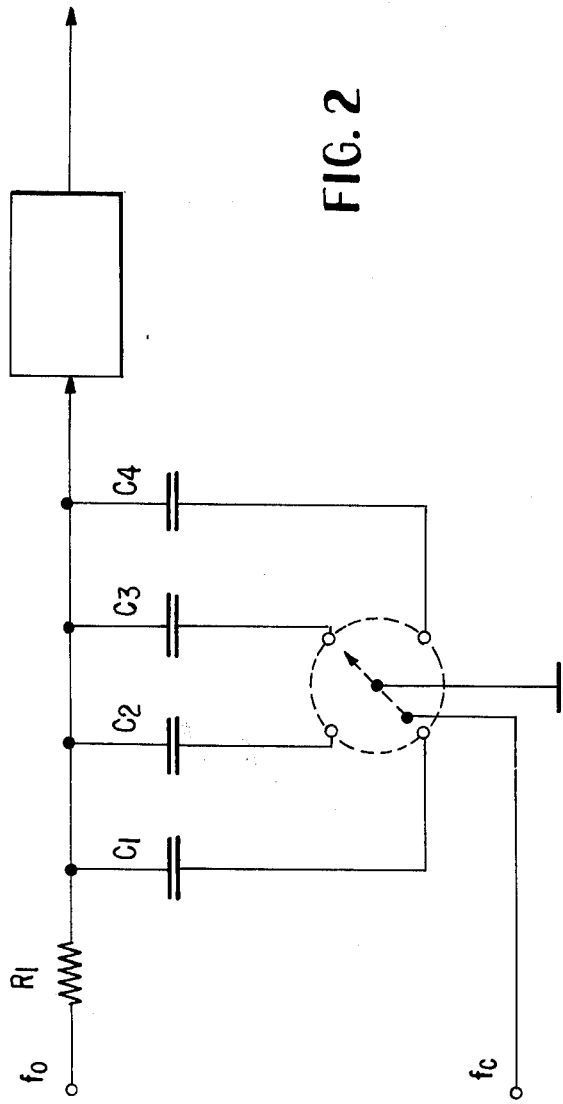
FIG. 2 is a schematic diagram of a sampled filter having four samples in each period of the input frequency.
Figure 4:
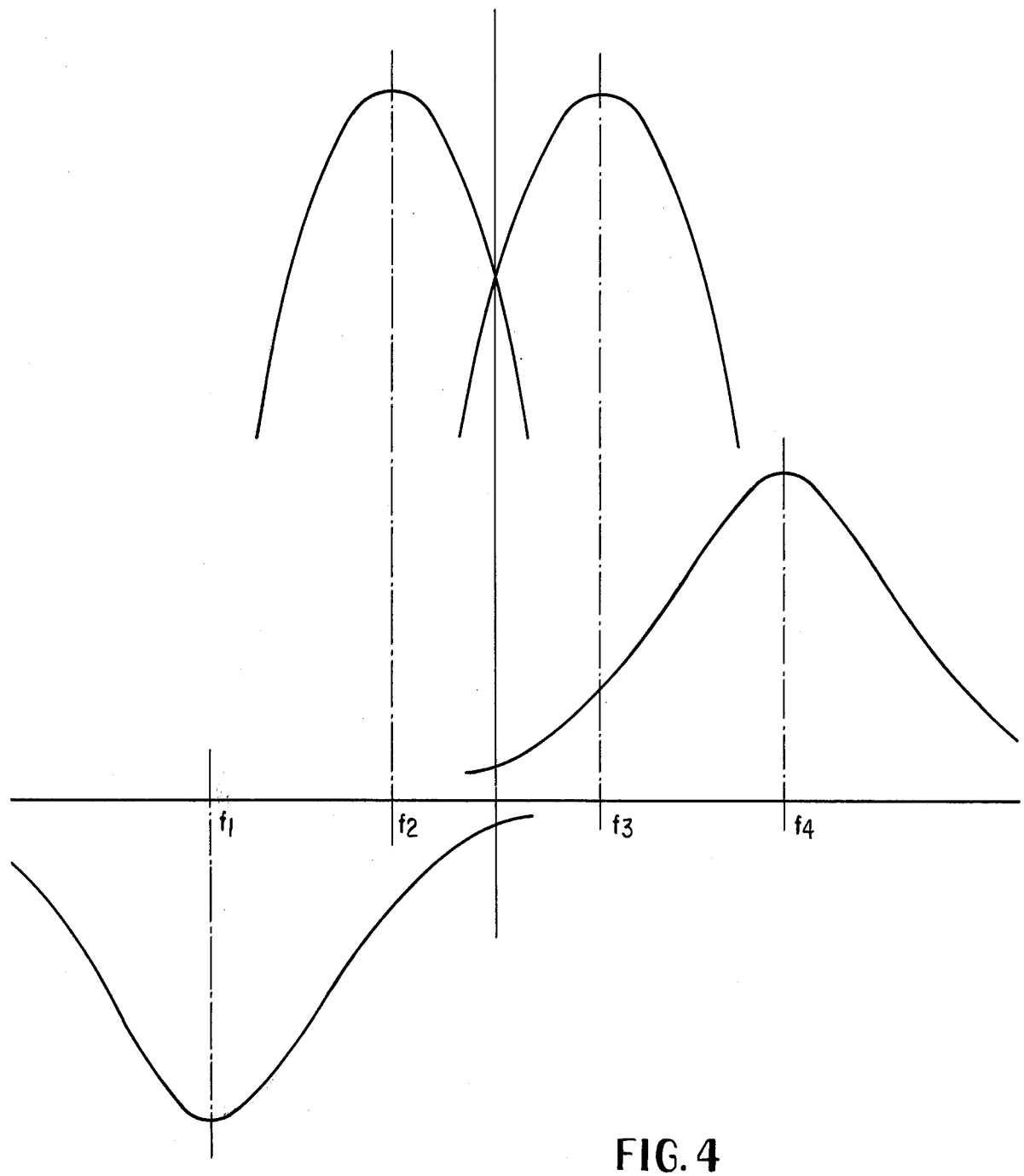
FIG. 4 shows the frequency response curves of the resonant components in the filter and in the discriminator of the present invention.

The output of second sampled filter 3, which also constitutes the output of filter F, is applied to the input of a discriminator D, specifically to the common input of two sampled filters 4 and 6, followed by two detecting devices 6 and 7, the outputs of which are applied respectively to the two inputs of a differential amplifier 8, so as to obtain the response curve shown in FIGS. 1B and 4.

The four sampled filters 2-5 are controlled by a control frequency generator 10, which receives as its control input, a signal of frequency $f_0$ produced by an oscillator 9. The generator 10 and produces as its output signals, signals having frequencies $f_1, f_2, f_3$ and $f_4$.

FIG. 4 shows the frequency response curves and the band-center frequencies of the sampled filters 2-5 which constitute the filter and the discriminator.

Such frequencies must be so selected as to meet the requirement that the center frequency of the device composed of the filter and of the discriminator passes through the "zero" position in the discriminator.

In the case of relatively narrow bands, as a result of the nearly arithmetical symmetry of the response curves, this requirement is sufficiently met if the two pairs of pilot frequencies of the filter and of the discriminator have the same arithmetical mean (see FIG. 4):

$$(f_1 + f_4/2) = (f_2 + f_3/2)$$

Frequencies that meet the above-mentioned requirement to a sufficient extent and, furthermore, are particularly stable, can be obtained with a single quartz oscillator through division by appropriate numbers.

Figure 5:
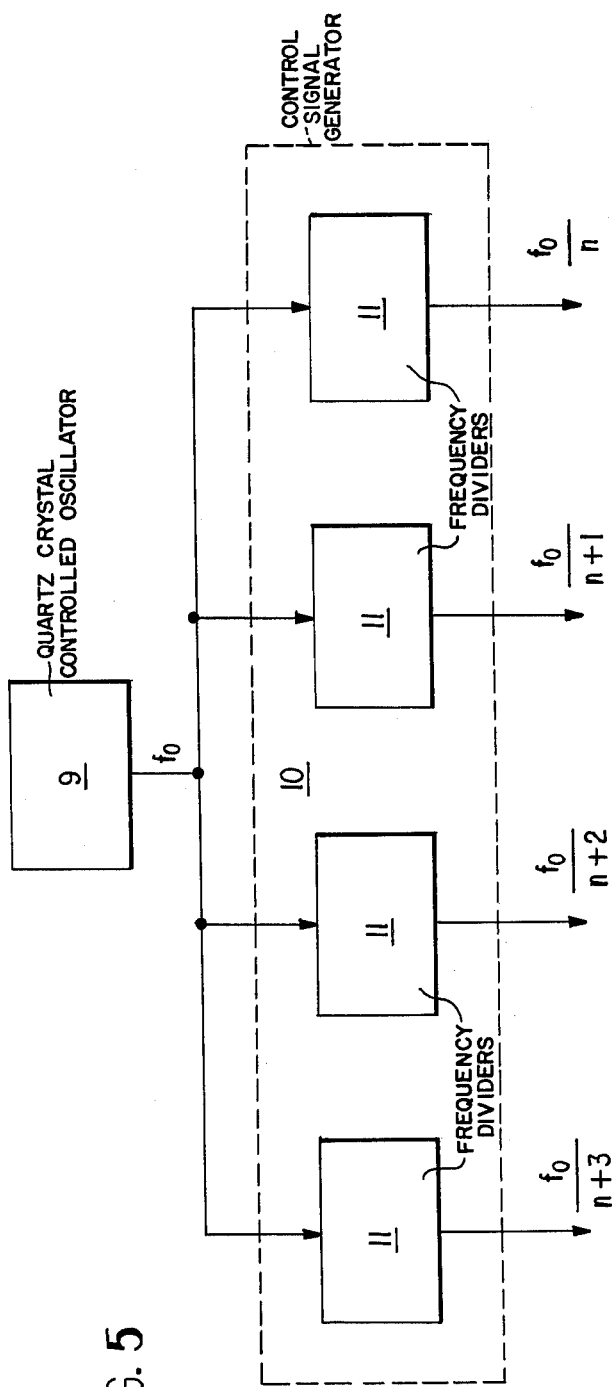
FIG. 5 is a schematic block diagram of an exemplary control frequency generator.

For example, as shown in the diagram in FIG. 5, it is possible to begin with a single oscillator of high $f_0$ frequency and to obtain pilot frequencies $f_1, f_2, f_3$ and $f_4$ (see FIG. 4), by the following ratios:

$$f_1^1 = f_o/n + 3$$

$$f_2 = f_o/n + 2$$

$$f_3 = f_o/n + 1$$

$$f_4 = f_o/n$$

Blocks 11, which as a whole constitute one possible arrangement of building the control frequency generator 10, are frequency dividers, well known in the art and easily available on the market.

In such case, the arithmetical means $f_o$ and $f_F$ of the two pairs of pilot frequencies of the discriminator and of the filter, respectively, are:

$$f_o = f2 + f4/2 = fo/2\, 2n + 3/n^2 + 3n$$

$$f_F = f2 + f4/2 = fo/2\, 2n + 3/n^2 + 3n + 2$$

and the relative difference between the two means is:

$$\epsilon R = F_D + f_F/f_D = 1 - (n^2 + 3n/n^2 + 3n - 2)$$

which obviously rapidly tends to become zero as in tends toward infinity.

For example: if $n = 100$:

$$\epsilon_R = 1.994 \cdot 10^{-4}$$

($\epsilon_R < 2$ by ten thousand).

It is understood that the four control sampling frequency signals can also be produced by other techniques known to experts in this field, such as, for example, by dividing the central frequency $f_o$, produced by a quartz oscillator, by two numbers $n_2$ and $n_3$ and subjecting the frequencies thus obtained to carrier suppression modulation, so as to obtain frequencies $f_1, f_2, f_3$ and $f_4$, allocated as shown in FIG. 4.

This technique makes possible to eliminate the difference $\epsilon_R$ completely, because the arithmetical means of the two pair of frequencies $f_1, f_4$ and $f_2, f_3$ are perfectly identical.

Figure 6:
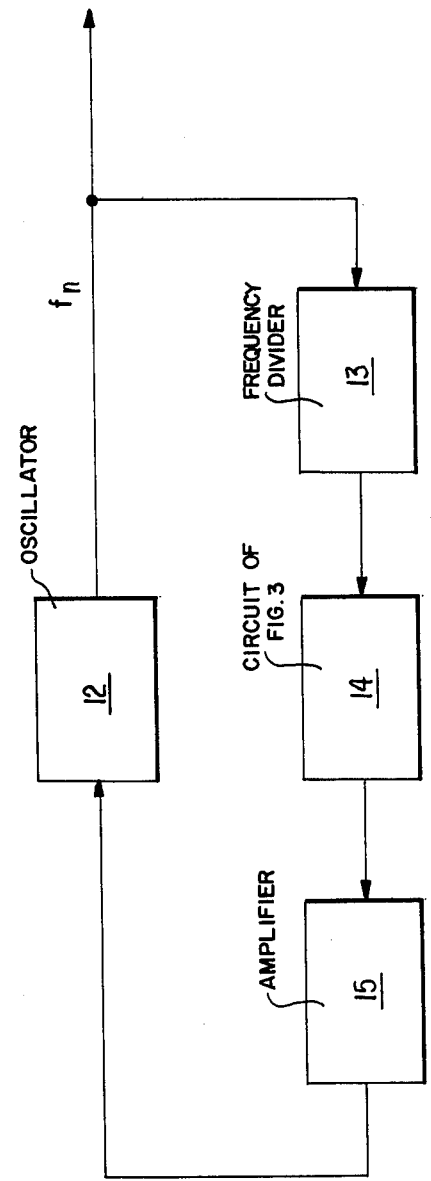

In order to illustrate possible uses of this invention more clearly, one possible use of the device covered by the invention is shown in FIG. 6, where 12 shows an oscillator that must be frequency-stabilized.

The signal produced by the oscillator is subsequently sent to the input of a frequency divider 13, the purpose of which is to produce a submultiple of frequency $f_n$ of the output oscillation, located within the operating band of device 14, to detect variations of $f_n$ from the "central" frequency $f_o$.

The output signal of the device 14, through an amplifier 15, is used to act upon the oscillator 12, so as to bring frequency $f_n$ of the output signal to the value of $f_o$.

Figure 7:
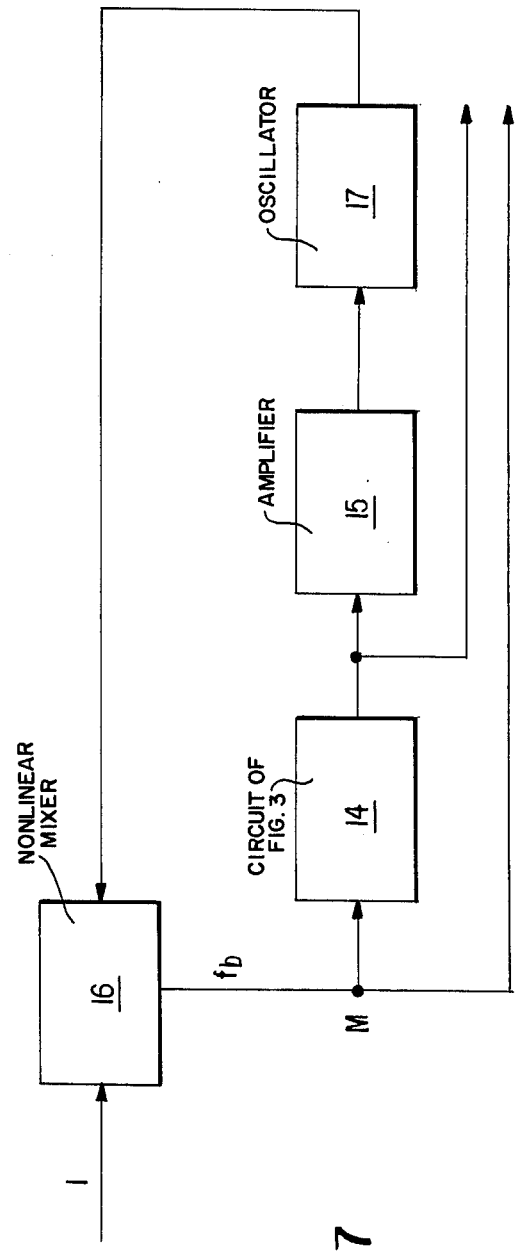
FIG. 6 and 7 are respective schematic block diagrams of two possible uses of devices constructed according to the present invention.

A further example of a use of the device covered by this invention is shown in FIG. 7, which concerns a circuit for frequency tracking.

The input signal found at point I and the output signal of a beat oscillator 17 are applied to the two inputs of a non-linear detector 16, which, at point M, produces beat signal $f_b$ of the two input frequencies. Such point constitutes the input of the device covered by this invention shown generally as block 14, which produces as its output a signal which is proportional to the difference between frequency $f_b$ and the central frequency $f_o$ of the device. Such signal, through the amplifier 15, is applied to the beat oscillator 17, so as to modify the oscillation frequency until the difference between $f_b$ and $f_o$ becomes zero.

Useful information provided by the output of the block diagram in FIG. 7 can be the output of the beat oscillator 17, the output of device 14 or of the mixer 16, depending on the method of use of the system.

The present invention has been described with reference to one specific method of construction, but it must be understood that it can be subjected to modifications and replacements without thereby exceeding the scope of the following industrial patent rights.

We claim:
1. A device for filtering and frequency discriminating an electric signal, the device comprising:
   a filter section including a band-pass filter, a first sampled resonant filter circuit and a second sampled resonant filter circuit connected in series, each of said first resonant filter circuit and said second resonant filter circuit having respective sampling control input means;
   a discriminator including a third sampled resonant filter circuit and a fourth sampled resonant filter circuit coupled in parallel to said second filter circuit and responsive to its output, each of said third resonant filter circuit and said fourth resonant filter circuit having respective sampling control input means, a first detecting means coupled to said third resonant filter circuit and responsive to its output, a second detecting means coupled to said fourth resonant filter circuit and responsive to its output, and an output differentiated amplifier coupled to said third and fourth resonant filter circuits and responsive to outputs therefrom for producing an output signal representative of the frequency of a signal received by said band pass filter; and
   means for producing and supplying respective sampling control signals of respective frequencies to each of said sampling control input means, said means for producing and supplying including a single high-stability oscillator feeding sampling control signal generating means.
2. A device according to claim 1, wherein said oscillator is a crystal controlled oscillator.
3. A device according to claim 2, wherein said crystal controlled oscillator in a quartz crystal controlled oscillator.
4. A device according to claim 7, wherein said sampling control signal generating means comprise four frequency dividers coupled to said high-stability oscillator for dividing the frequency of the signal received from said oscillator by four respective fixed integral numbers.
5. A device according to claim 4, wherein said four respective fixed integral numbers have the values $n$, $n+1$, $n+2$ and $n+3$.

* * * * *